United States Patent [19]

Zimmerman

[11] Patent Number: 5,172,213
[45] Date of Patent: Dec. 15, 1992

[54] MOLDED CIRCUIT PACKAGE HAVING HEAT DISSIPATING POST

[75] Inventor: Michael A. Zimmerman, North Andover, Mass.

[73] Assignee: AT&T Bell Laboratories, Murray Hill, N.J.

[21] Appl. No.: 704,532

[22] Filed: May 23, 1991

[51] Int. Cl.$^5$ .................... H01L 23/28; H01L 23/48
[52] U.S. Cl. .................... 257/796; 165/80.2; 361/381; 361/389; 257/675
[58] Field of Search .................... 357/70, 72, 74, 81; 361/381, 386, 389; 165/80.2

[56]    References Cited
        U.S. PATENT DOCUMENTS

| 4,532,539 | 7/1985 | Frister | 357/81 |
| 4,649,992 | 3/1987 | Geen et al. | 165/185 |
| 4,910,583 | 3/1990 | Behr et al. | 357/81 |
| 5,053,855 | 10/1991 | Michii et al. | 357/81 |
| 5,105,259 | 4/1992 | McShane et al. | 357/72 |

*Primary Examiner*—Rolf Hille
*Assistant Examiner*—David Ostrowski
*Attorney, Agent, or Firm*—E. Weiss

[57]    ABSTRACT

A major issue in the semiconductor industry is the amount of power that a silicon device dissipates. As the density of silicon integrated circuits increases with improvements in wafer processing, so does the amount of heat which must be evacuated. If the power of the silicon devices exceeds one watt, the plastic encapsulating material normally yields to the more expensive ceramic or metal packages which can dissipate thermal energy more efficiently. The conventional molded package is a silicon device such as a chip mounted onto a copper paddle which spreads the heat radially in the material and is bonded to leads via thin wires. The three major paths for the heat to escape are by conduction through the molding compound to the surface of the package where removal is by convection, and by conduction from the silicon device through the thin wires to the leads of the package and then to the printed circuit board, and by a heat conducting paddle which radially spreads the heat through the molding compound. In each instance, the heat dissipating path is through a relatively poor thermal conductor. In accordance with the principles of the invention, there is provided an improved thermal path for conducting heat from the silicon device to the surface of the plastic package. The improved thermal path comprises a post of heat conducting material positioned to extend from the silicon device to a surface of the plastic package. One end of the post is positioned to receive heat generated by the silicon device and the other end is exposed to air at the surface of the plastic package. A waist section of the post located between the ends of the post has a dimension which is different than that of the end. Additionally the ends can have dimensions which are either equal or unequal. The post configuration enables the molded package to capture the post without creating cracks in the molded package.

13 Claims, 6 Drawing Sheets

MOLDED CIRCUIT PACKAGE HAVING HEAT DISSIPATING POST

TECHNICAL FIELD

This invention relates to semiconductor devices coupled to a lead frame embedded within an encapsulating material.

BACKGROUND OF THE INVENTION

Initially, silicon-integrated devices were packaged in sealed metallic packages. Currently, plastic molding compounds, the low cost option for reliable, high quality devices, has replaced the metallic packages and accounts for about 90 percent of the 30 billion devices packaged throughout the world each year. The concept of encapsulating one or more silicon devices within a plastic package has materially contributed to reducing the cost of the packaged device. A result of encapsulating silicon devices in plastic is the use of silicon devices in a wide array of products with minimum environmental restrictions.

An important factor in the design of integrated circuits encapsulated within a plastic is the power rating of the device. Clearly, as the density of silicon devices within the plastic package increases, the issue of evacuating the heat generated becomes more severe.

Typically, if the power rating of the silicon devices exceeds one watt, plastic encapsulation is usually abandoned in favor of either ceramic or metal packages which can dissipate more thermal energy. A major disadvantage of ceramic and metal packages is that they are more expensive than plastic packages.

The present invention is directed toward solving the poor thermal dissipation properties associated with silicon devices encapsulated within a plastic.

SUMMARY OF THE INVENTION

A major issue in the semiconductor industry is the amount of power that a silicon device dissipates. As the density of silicon integrated circuits increases with improvements in wafer processing, so does the amount of heat which must be evacuated. If the power of the silicon devices exceeds one watt, the plastic encapsulating material normally yields to the more expensive ceramic or metal packages which can dissipate thermal energy more efficiently. The conventional molded package is a silicon device such as a chip mounted onto a copper paddle which spreads the heat radially in the material and is bonded to leads via thin wires. The three major paths for the heat to escape are by conduction through the molding compound to the surface of the package where removal is by convection, and by conduction from the silicon device through the thin wires to the leads of the package and then to the printed circuit board, and by a heat conducting paddle which radially spreads the heat through the molding compound. In each instance, the heat dissipating path is through a relatively poor thermal conductor. In accordance with the principles of the invention, there is provided an improved thermal path for conducting heat from the silicon device to the surface of the plastic package. The improved thermal path comprises a post of heat conducting material positioned to extend from the silicon device to a surface of the plastic package. One end of the post is positioned to receive heat generated by the silicon device and the other end is exposed to air at the surface of the plastic package. A waist section of the post located between the ends of the post has a dimension which is different than that of the end. Additionally the ends can have dimensions which are either equal or unequal. The post configuration enables the molded package to capture the post without creating cracks in the molded package.

BRIEF DESCRIPTION OF THE DRAWINGS

In the drawings forming a part of this application and in which like parts are designated by like reference numeral throughout the same.

DETAILED DESCRIPTION

Most silicon devices packaged in plastic consists of electrical leads interconnecting small bond pad spaces of the device to the larger lead spacings that can be accommodated by the next higher level of interconnection such as a printed circuit board. The packages can also include power and ground distribution planes, internal interconnection patterns, and thermal dissipation structures. Package leads are supported or encapsulated in a package body. They protrude from the package and are attached to the bonding sites of the printed wiring board. There are several major package types used by the electronics industry. These include, but are not limited to pre-molded plastic and post-molded plastic.

A pre-molded plastic package comprises a member which is mounted in a recess of a prefabricated plastic body and is attached to a leadframe, an assembly of a fan-out pattern of either punched or etched metal members via wire bonds.

These packages, which are nonhermetic, are sometimes necessary to accommodate very high lead devices, or to provide plastic pin grid arrays that are difficult to mold. Prefabricated packages based on multiplayer printed wiring board, normally known as plastic multilayer packages are an important option for packaging high lead count devices that cannot be handled with post-molding.

Most plastic packages are post-molded, which means that the package body is molded over the assemblage after the silicon device has been attached to the fan-out pattern of externally extending outer leads.

Following molding, the plastic package usually requires some secondary operations such as a large batch post cure or post polymerization to complete the polymerization reaction. The leads are then formed to their final configuration in a trim and form operation. Other secondary operations can include writing information on the package; testing; and a burn in test where the device is operated at elevated temperatures and bias to eliminate premature failures.

Figure 1:
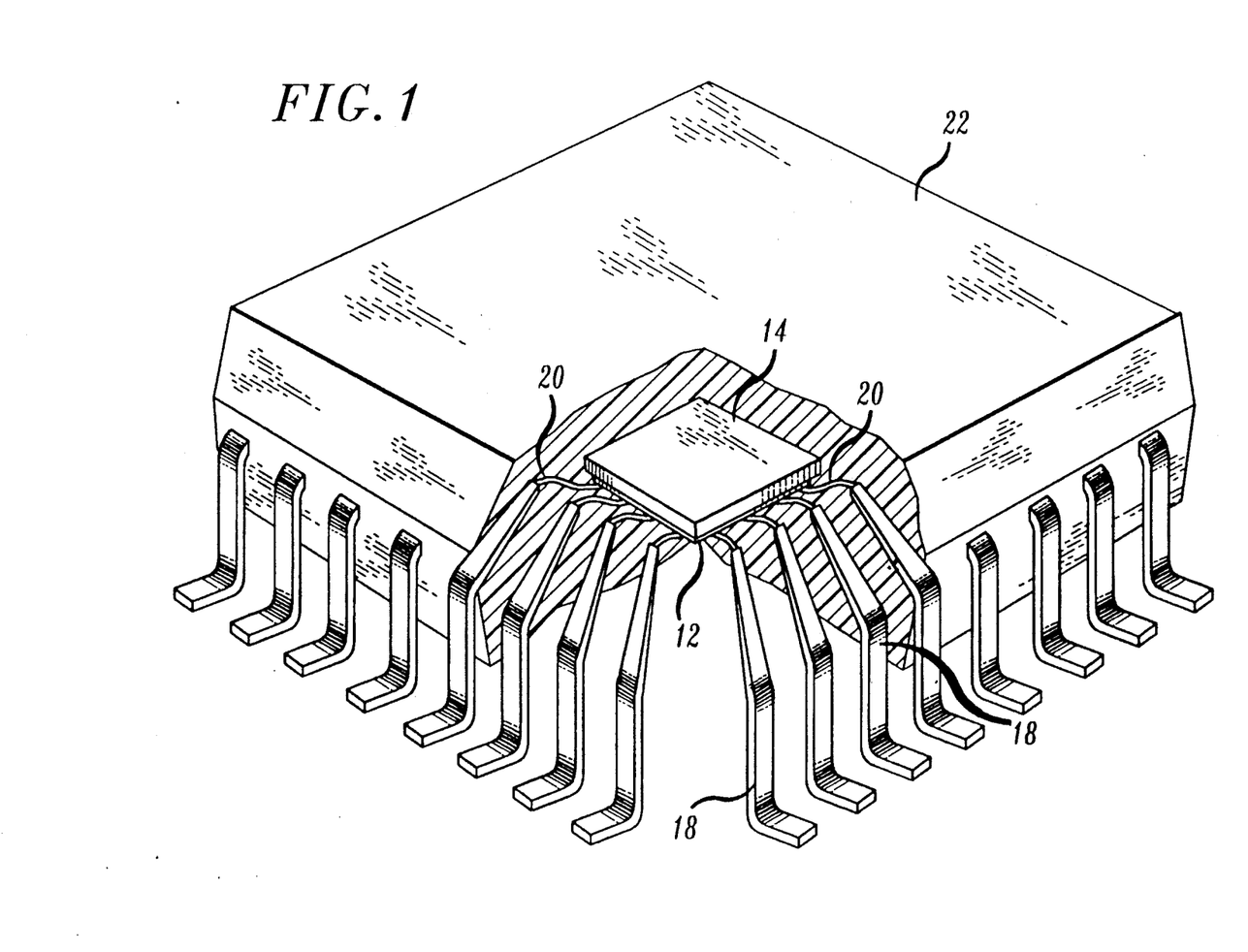
FIG. 1 illustrates a cutaway view of a typical prior art molded circuit package.

Referring to FIG. 1 there is illustrated a cutaway view of a typical plastic leaded chip carrier. A silicon device 12, also referred to as a chip, is mounted to a paddle 14, typically a strip of copper alloy through a low stress and thermally conductive adhesive 16 (see FIG. 2). Electrical connections are made from the silicon device 12 to leads 18 through fine gold wire bonds 20. The paddle 14, silicon device 12 and the ends of the leads 18 connected to the silicon device through the fine gold wire bonds 20 are embedded in the plastic molding compound 22 which provides support and electrical isolation for the assemblage.

The leads 18 for surface mount packages are normally 'j' leads or gull wing leads. J leads extend under the molded body and conserve area on the circuit board. However, they are difficult to inspect. Gull wing leads, such as leads 18 are formed to extend away from the molded body and allow for visual inspection of solder attachments to the printed circuit board. Fine pitch plastic quad flat packages typically use gull wing leads because attachment yield is more of an issue.

Briefly, there are several different organic and inorganic materials used to package microelectronic devices. They include copper-rich alloys and an iron-nickel alloy. Iron-nickel has a coefficient of thermal expansion which is closer to silicon and has better mechanical properties than the copper-based alloys. The disadvantage of iron-nickel is that it has a low thermal conductivity. The ever increasing need to dissipate heat as the devices become larger require using copper alloys, it being remembered, however, that these materials have limitations on thermal expansion and mechanical properties.

The metal leads 18 have a direct effect on the performance characteristics of the device as they provide a path for removing heat from the silicon device. The leads are formed from punched sheet stock. Those which require high interconnection density, such as 164-lead packages and above, are normally formed by etching because the inner lead spacing is too small to be formed with a punching tool. Gold or aluminum wires 20 are used to connect the ends of the leads to the band pads on the silicon device.

The encapsulating material, which is a thermoset polymer molding compound, is one of the most important materials in molded plastic packaging. The molding polymer is converted from a low-viscosity fluid to a hard plastic during the process. Although it has a softening point, or glass transition temperature, it does not flow after polymerization, even at soldering temperatures, because it has a cross-linked molecular architecture.

Epoxy is the cross-linkable resin for nearly all commercial molding compounds. The formulation consists of a mixture of epoxy resin, hardener, catalyst, fillers, flame retardants, flexiblizers, coupling agents, mold release agents and colorants. Important molding compound properties include low viscosity to prevent damage to the fragile assemblies during molding, rapid cure to provide high productivity and low thermal shrinkage forces caused by differences in coefficient of thermal expansion among molding compound, leadframe and the silicon device.

Present day low-stress molding compounds have low coefficient of thermal expansion and low modulus to minimize the stresses generated, excellent strength to resist the cracking these stresses promote, and good adhesion to the silicon device and lead frame to disseminate the stresses over the entire package volume. Normally, the molding compound contains about 75 percent by weight of inorganic filler, e.g., ground silicon to lower the coefficient of thermal expansion and increase thermal conductivity. Higher filler loadings achieved through improvements in filler size and size distribution have lowered the coefficient of thermal expansion while reducing the material viscosity.

Almost all post-molded plastic packages are made by a transfer molding process using thermoset molding compounds. The assembled lead frames are loaded on the molding tool either manually or with an automated leadframe loader. The molding compound is pre-softened by heating it in a dielectric preheater above its glass transition temperature. It is then placed in a cylindrical cavity in the molding tool. The operator starts the transfer by beginning the plunger movement that pushes the molding compound out of the transfer pot and into the mold. After the mold is filled, the pressure is increased and the molding compound is packed and further polymerized under a higher applied pressure. Packing is important because the material is porous after filling. Packing compresses both macroscopic and microscopic voids in the molded body, lowers package permeability and eliminates voids where liquid water could collect and promote corrosion.

There are several well-defined failure mechanisms associated with plastic packaging and most involve one or more of the following phenomena: corrosion introduced by ionic impurities in the molding compound; device cracking introduced by differential thermal shrinkage; and, package cracks induced by thermal shrinkage or vaporization of water during surface mount attachment to the printed wiring board.

The presence of ionic impurities in the molding compound have been reduced to a low level and, therefore, this issue is rapidly diminishing. Moisture-induced failures during surface mount are currently being addressed through new handling procedures and molding compound improvements.

However, thermomechanical stress continues to be an important problem because market pressures demand that larger pieces of silicon be placed in smaller and smaller packages. Stress cracking of the package or passivation layer can occur if the package design or choice of molding compound is incorrect.

One approach to addressing stress is material selection based on evaluating the mechanical properties of the molding compound. There are large differences in properties among commercial molding compounds, and it is impossible to evaluate them all in reliability trials with line devices.

The packaging of devices is influenced by changes in device fabrication technology as well as by new trends in circuit board assembly operations and system configurations. One important trend that affects molded plastic packaging is power dissipation.

Device reliability drops rapidly as temperatures increase because high temperatures accelerate the chemical processes of failure at the semiconductor level. Power dissipation is probably the most urgent issue facing low-cost plastic packaging because power levels of leading mass-produced products are now at the limit of what can be dissipated through a plastic package while still maintaining acceptable device junction temperatures.

The thermal conductivity of the molding compound can be increased by switching the inorganic filler from silica to materials such as alumina, silicon carbide, or aluminum nitride that have thermal conductivities tens to hundreds of times greater than silica. This change can increase the thermal conductivity of the molding compound by two to five times. However, this increase provides only a temporary solution. The problem with other fillers are the sharply higher abrasiveness and reduced flow properties of the molding compound.

Figure 2:
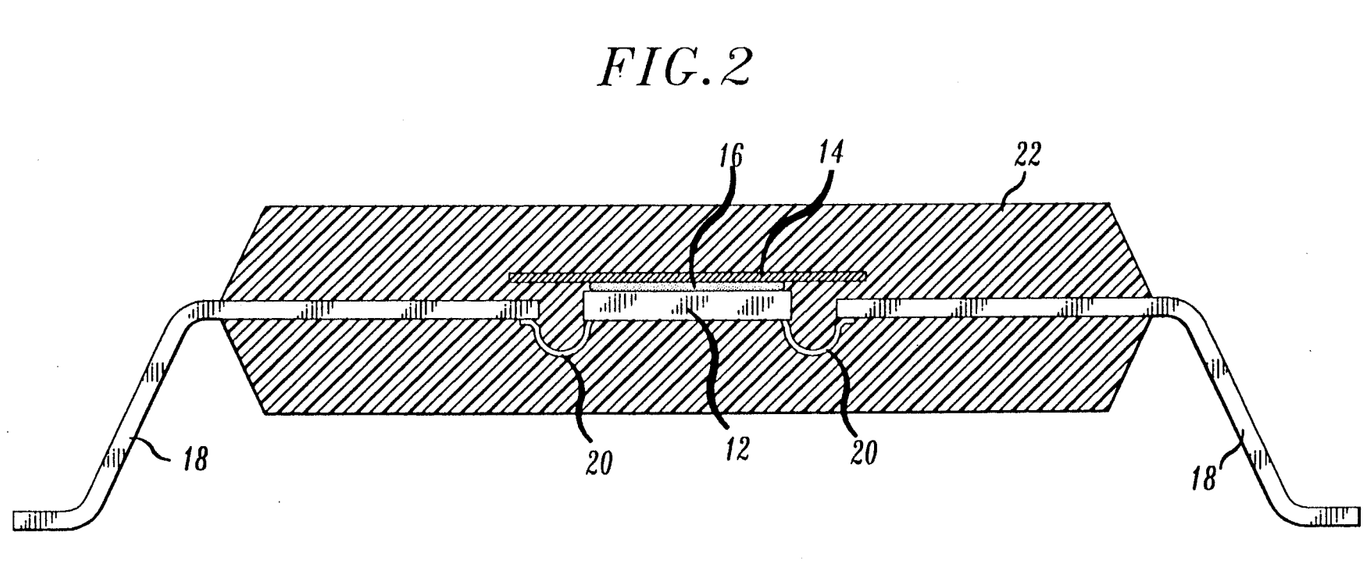
FIG. 2 illustrates a cross sectional view of the typical prior art molded circuit package of FIG. 1.

Referring to FIG. 2, there is illustrated a cut away side view of the circuit package of FIG. 1. This view more clearly shows the physical relationship between the silicon device 12, the thermally conductive adhesive 16, the paddle 14, the fine wire bonds 20 and the leads 18 encapsulated within the plastic molding compound 22. It is to be noted that the paddle does not make direct contact with the leads 18 and, therefore, heat from the paddle must travel through the plastic compound 22 to reach the leads 18 and the air at the surface of the package. The only direct heat dissipation path is through the fine wire bonds 20 to the leads 18. Unfortunately, because the wire bonds 20 are fine, the heat which can be conducted is limited.

Within a molded plastic package, the thermal dissipation mechanism consists of three primary paths. The heat can be dissipated by conduction through the molding compound to the surface of the package where it is then lost through convection. But, this is a relatively poor path as the molding compound has a low thermal conductivity. The heat also passes through the silicon device to the attached paddle 14, a metallic member thermally coupled to the silicon device 14. The paddle only spreads the heat radially within the molding compound. Heat also passes from the silicon device through wirebands 20 to the leads 18 and then to the printed circuit board.

Because of the relatively poor thermal conductivity of the plastic molded packages, ceramic packages have been traditionally used for applications of one watt or greater. It is because of the higher thermal conductivity of the ceramic body compared to that of the plastic package that heat is more efficiently conducted to the leads and component surfaces for removal from the device.

Figure 3:
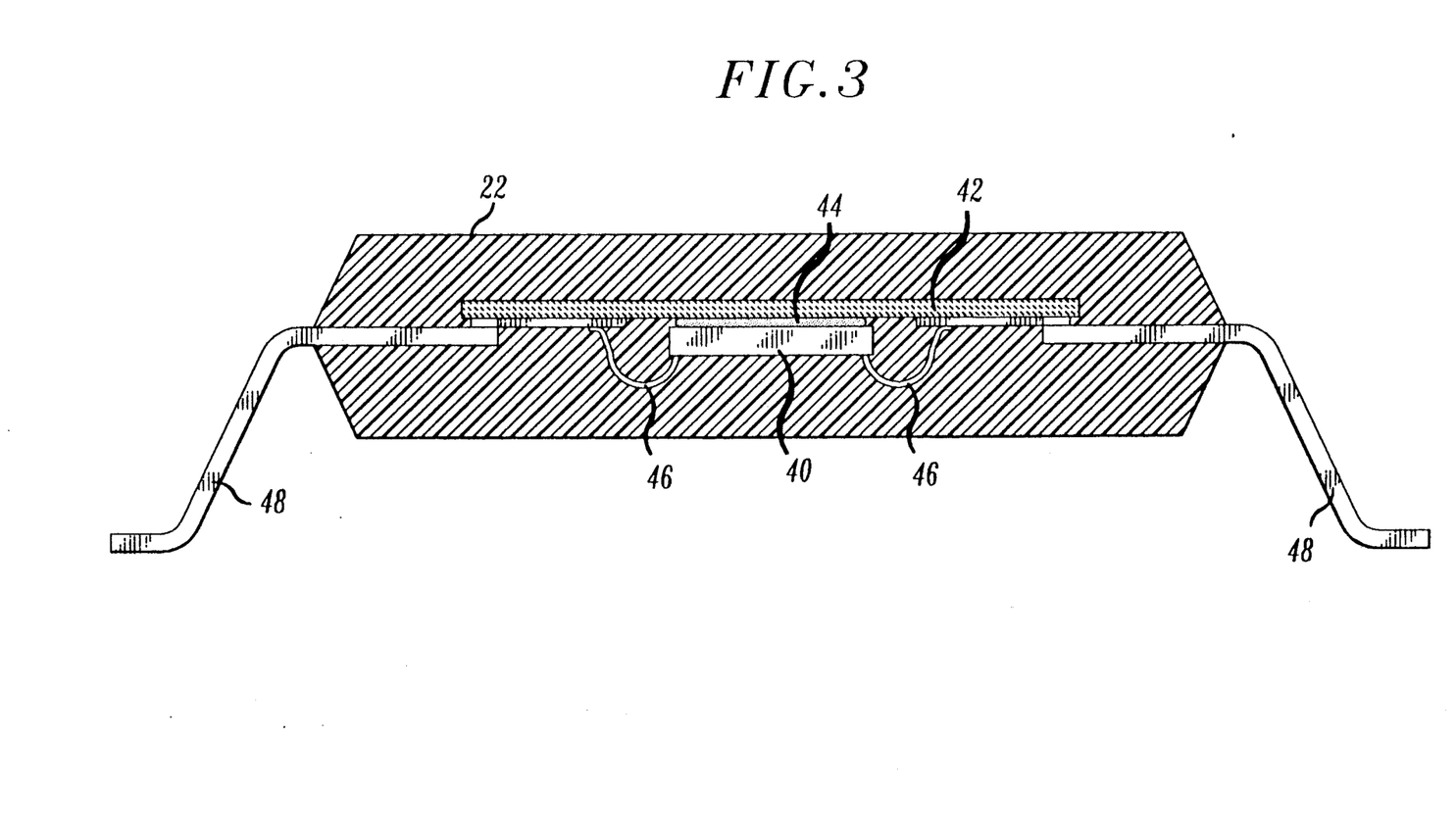
FIG. 3 illustrates a cross sectional view of another molded circuit package.

A circuit package that incorporates the low cost features of the plastic leaded chip carriers and provides significant heat dissipating properties is illustrated in FIG. 3. In this embodiment a silicon device 40 is secured to a ceramic member 42 by thermally conductive epoxy adhesive 44. The ceramic member 42 supports conductive paths for making electrical connections from the silicon device to the leads. Fine wire bonds 46 electrically connect the various bond pads on the silicon device 40 to appropriate conductive paths on the ceramic member 42. The conductive paths on the ceramic member 42 are also connected electrically to the ends of the various lead 48. As with the embodiment of FIGS. 1 and 2; the ceramic member 42, silicon device 40, wire bonds 46 and ends of the leads 48 are embedded within the plastic molding compound. It is to be noted, however, in the embodiment of FIG. 3, the ceramic member provides a direct heat conducting path from the silicon device to the leads. There is no plastic molding compound in the heat conducting path from the silicon device to the leads.

The ceramic member has relatively good heat conducting properties and, therefore, more efficiently conducts the heat from the silicon device to the leads where it is distributed to the circuit board and the air.

The embodiment of FIG. 3 provides a clear increase in thermal performance over conventional molded packages. This is due to the fact that the ceramic member 42 which is substantially 99.6% alumina is bonded to the silicon device which, in turn, is rigidly attached to the leads by soldering. The ceramic member acts as a heat spreader to draw the heat away from the silicon device to the leads and then to the printed circuit board. This offers a substantial thermal advantage over the conventional molded package.

Figure 4:
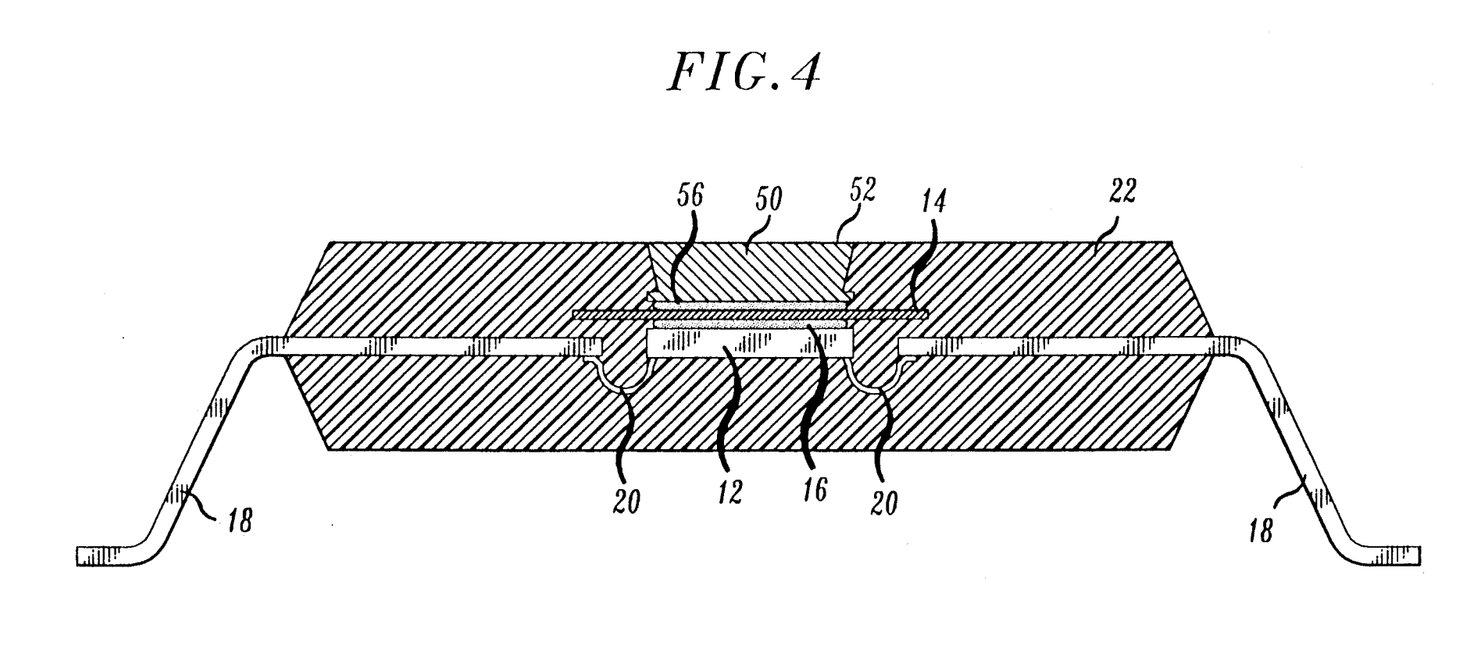
FIG. 4 illustrates a cross sectional view of the structure of FIG. 1 in accordance with the principles of the invention.

Referring to FIG. 4, there is illustrated one embodiment of a structure in accordance with the principles of the invention for removing heat from a molded circuit package. In this embodiment the invention is illustrated in combination with the molded circuit package of FIGS. 1 and 2. As illustrated in FIG. 1, the silicon device 12 is connected to the paddle 14 with heat conducting epoxy adhesive 16 and electrically connected to the various leads 18 via fine wire bonds 20. To this assemblage a heat post is added. The heat post provides an improved thermal conducting path from the silicon device to the surface of the package.

A post 50 is mounted directly to the paddle 14 opposite to where the heat dissipating silicon device 16 is attached to the paddle. The post 50 is attached to the paddle with an epoxy adhesive which has good heat conducting characteristics. As illustrated in FIG. 4, the adhesive should not extend beyond the edge of the post. The post can be made of a metallic material such as brass or the like which has a thermal impedance which is substantially less than that of the molding compound. The assemblage of the heat post, the paddle, the silicon device, the fine wire bonds 20 and the end of the leads 18 connected to the wire bonds 20 are embedded within the plastic molding compound. The top surface 52 of the post 50 can be either above, below or flush with the surface of the molding compound and exposed to air. If desired, further improved thermal performance can be obtained by adding a heat sink to the top exposed surface 52 of the heat post 50.

In the embodiment illustrated in FIG. 4, the post 50 is mounted to the paddle opposite to the heat dissipating silicon device. It is understood that, in another embodiment, the paddle 14 can be removed and the post 50 can be mounted directly to the silicon device.

Figure 5:
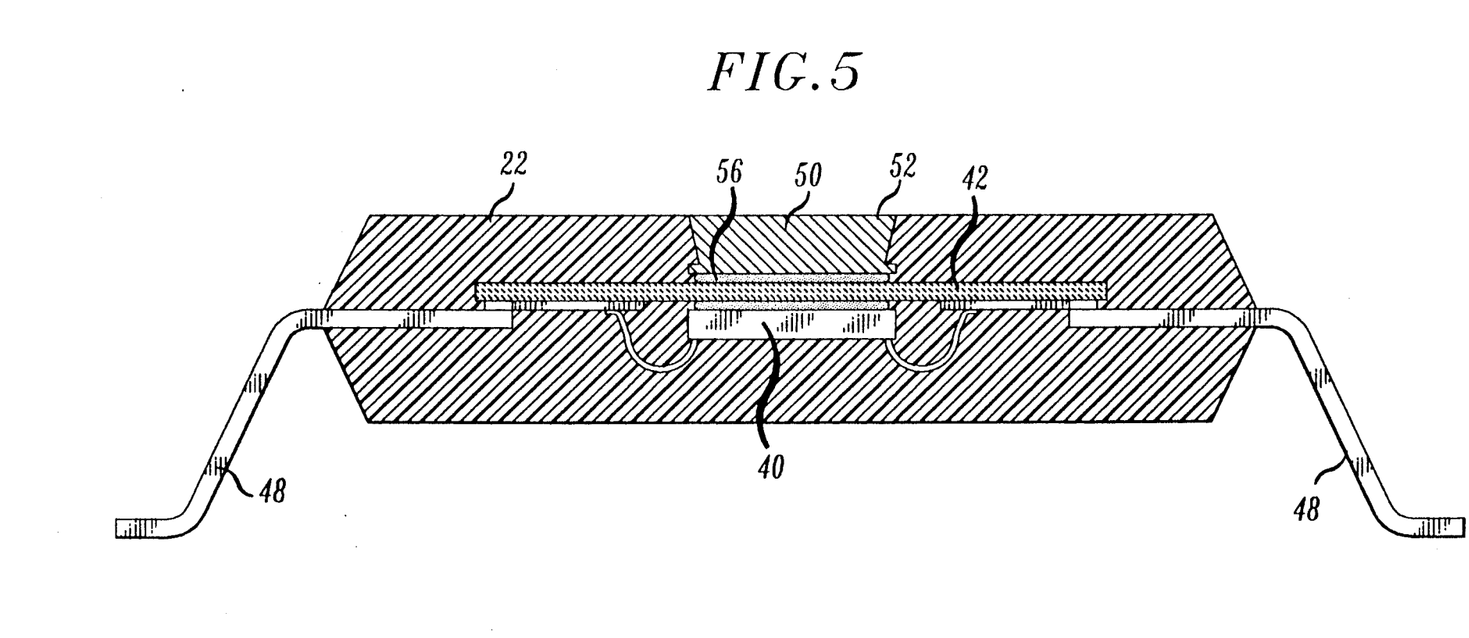
FIG. 5 illustrates a cross sectional view of the structure of FIG. 3 in accordance with the principles of the invention.

Referring to FIG. 5, there is illustrated another embodiment of structure for removing heat from a molded circuit package in accordance with the principles of the invention. In this embodiment the invention is illustrated in combination with the molded circuit package of FIG. 3. More specifically, the post 50 which can be made of brass or the like is attached to the ceramic member 42 by means of a heat conducting epoxy adhesive 56. The adhesive 56 is applied sparingly so that it does not extend beyond the edge of the post. The epoxy is recessed from the edge of the post to allow the plastic molding compound to flow around the bottom edge of the post.

The assemblage of the post 50, ceramic member 42 silicon device 40 and ends of the leads 48 attached to the ceramic member 42 are encapsulated with plastic molding compound. The top surface 52 of the post 50 is not covered with the plastic molding compound and, therefore, is exposed to the air. If desired, a heat sink can be coupled to the surface 52 of the heat post to increase the rate of heat description.

Typical reliability criteria call for molded hybrid integrated circuit packages to be able to withstand in excess of 100 temperature excursions from −45° C. to +135° C. without developing large stresses and/or cracks within the package. Stresses are a function of the material properties of the various components, specifically the paddle or ceramic member, silicon, metallic heat post, molding compound, thermal expoxies, leadframe material and the like. In addition, stress is a function of the design of the entire package or assemblage, including the location of the paddle or ceramic member and the design of the heat post itself.

Figure 6:
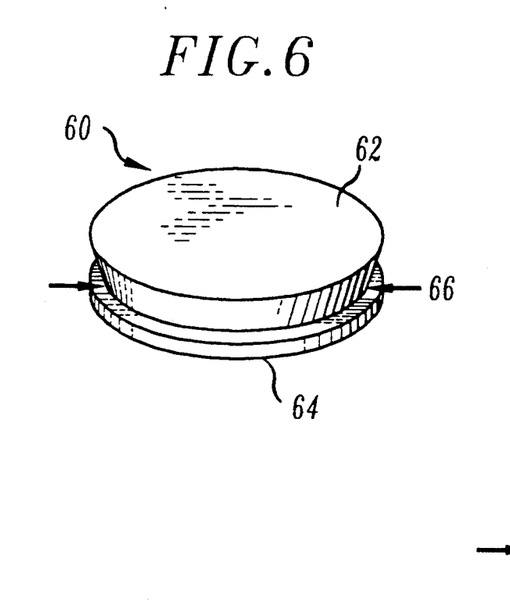
FIG. 6 illustrates a view of one embodiment of a post for conducting heat away from a silicon device in accordance with the principles of the invention.

The shape and material used for the heat post are significant factors which assure that the molded circuit package does not crack during temperature cycling. A heat post configuration which minimizes stresses within the package during temperature cycling and, therefore, avoids the creation of cracks in the package is illustrated in FIG. 6. Referring to FIG. 6, there is illustrated a heat post in accordance with the principles of the invention. More specifically, the heat post 60 has a first end face or surface 62, a second end face or surface 64 and a waist section 66 located between said first and second end surfaces. The dimension of the waist section is not equal to that of the end faces 62, 64; and, the dimension of the first end face can be equal to, greater than or smaller than that of the second end face. It has been determined that this configuration enables the molding compound to capture the heat post without having cracks form in the molding compound. It is understood that the term dimension can mean radius, diameter, area of the like.

Figure 7:
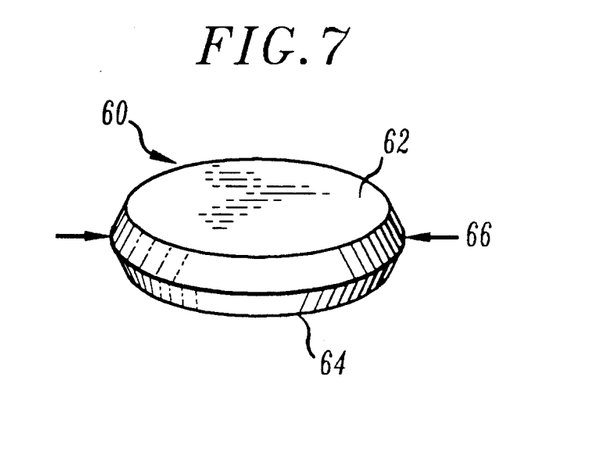
FIG. 7 illustrates a view of another embodiment of a post for conducting heat away from a silicon device within a molded circuit package in accordance with the principles of the invention.
Figure 8:
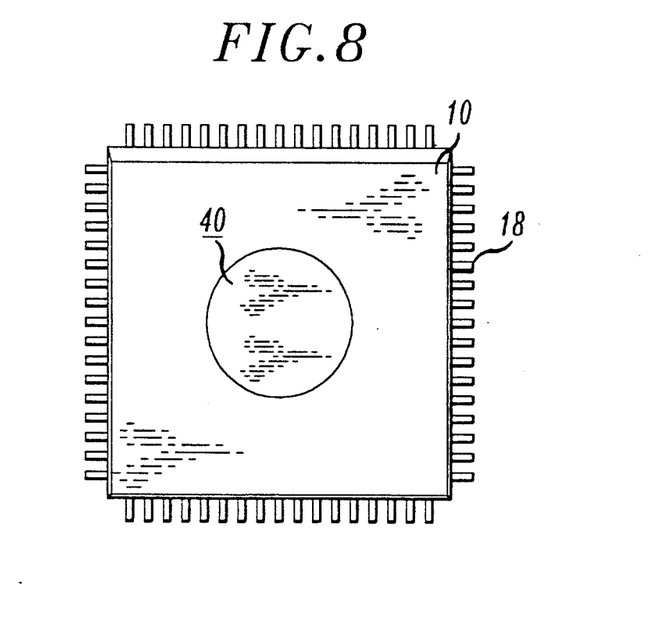
FIG. 8 illustrates a top view of the structure of FIG. 4 or 5 showing a surface of the post at the surface of the molded circuit package.

In FIG. 6, the heat post is configured to be a truncated cone with a flange at one end. It is to be understood that the heat post can also be configured to be a double truncated cone as illustrated in FIG. 7. Obviously, the double truncated cones of FIG. 7 can be reversed so that the smaller ends of the cones are attached to each other. Depending upon design, the end faces 62, 64 of the heat post 60 of FIG. 6, or the end faces 62, 64 of heat post 60 of FIG. 7 can have equal or unequal dimensions. Similarly the distance from the waist 66 to end faces 62, 64 of FIG. 6 or FIG. 7 can be equal or unequal.

The heat post can be made of brass because brass has a coefficient of thermal expansion which closely matches that of the molding compound and the copper leadframe. Additionally, brass does not oxidize easily and, therefore, is a very useful material for the packaging of semiconductors, where corrosion is a failure mechanism.

The heat post is attached to the paddle or ceramic member with epoxy adhesive which has good heat transfer properties. The adhesives should be sufficiently thin to effectively conduct heat from the paddle or ceramic member to the heat post and, at the same time, the adhesive should be sufficiently thick to function as a strain relief member between the paddle or ceramic member and the heat post because of the relatively large mismatch of thermal coefficient of expansion between there members. In practice, it has been determined that an adhesive thickness of 0.005 of an inch gives good results. It has also been determined that the adhesive should not extend beyond the face of the heat post as the molding compound does not form a strong band with the adhesive.

If desired, when the molded hybrid integrated circuit package contains multiple silicon devices, the single heat post can be replaced with multiple heat posts.

I claim:

1. A molded circuit package comprising
   thermoset polymer molding compound,
   a silicon device encapsulated within said compound,
   metal leads having inner ends and outer ends, said inner ends being encapsulated with said molding compound and electrically coupled to bonding pads on said silicon device, and said outer ends extending beyond said molding compound,
   a post having a first end surface, a second end surface and a mid section between said first and second surfaces, said mid section having a cross sectional area which is different than the area of either said first or second end surfaces, said second end surface being coupled to said silicon device with thermally conductive bonding means to conduct heat from said silicon device to said post through said second end surface, said second end surface and said mid section being encapsulated within said molding compound, and said first end surface being exposed to air wherein the shape of the post enables the molding compound to capture the heat post and prevent thermally-mechanically induced cracks from forming in the molding compound.

2. The molded circuit package of claim 1 wherein the area of said mid section is less than the area of said first end surface and of said second end surface.

3. The molded circuit package of claim 1 wherein the area of said mid section is greater than the area of said first end surface and said second end surface.

4. The molded circuit package of claim 1 wherein the area of said first end surface is substantially equal to the area of said second end surface.

5. The molded circuit package of claim 1 wherein the area of said first end surface is different from the area of said second end surface.

6. The molded circuit package of claim 2 wherein the area of said first end surface is substantially equal to the area of said second end surface.

7. The molded circuit package of claim 2 wherein the area of said first end surface is different from the area of said second end surface.

8. The molded circuit package of claim 3 wherein the area of said first end surface is substantially equal to the area of said second end surface.

9. The molded circuit package of claim 3 wherein the area of said first end face is different from the area of said second end surface.

10. The molded circuit package of claim 1 further comprising
    a heat conducting means interposed between said silicon device and said second end surface of said post, thermally conductive means coupling said heat conducting means to said second end surface, and
    thermally conductive means coupling said heat conducting means to said silicon device.

11. The molded circuit package of claim 10 wherein said heat conducting means is ceramic.

12. The molded circuit package of claim 10 wherein said heat conducting means is metal.

13. The molded circuit package of claim 10 wherein said heat conducting means is thermally enhanced plastic.

* * * * *